United States Patent [19]

Kramer et al.

[11] Patent Number: 4,695,800
[45] Date of Patent: Sep. 22, 1987

[54] NON HARMONIC NMR SPIN ECHO IMAGING

[75] Inventors: David M. Kramer, Cleveland Heights; Russell A. Compton, Chesterland; Lawrence M. Strenk, Middleburg Hts.; James B. Murdoch, Solon, all of Ohio

[73] Assignee: Technicare Corporation, Cleveland, Ohio

[21] Appl. No.: 742,161

[22] Filed: Jun. 6, 1985

[51] Int. Cl.⁴ ............................................. G01R 33/20
[52] U.S. Cl. ....................................................... 324/309
[58] Field of Search .......................................... 324/309

[56] References Cited

U.S. PATENT DOCUMENTS

| 4,297,637 | 10/1981 | Crooks et al. | 324/309 |
| 4,318,043 | 3/1982 | Crooks et al. | 324/309 |
| 4,443,760 | 4/1984 | Edelstein et al. | 324/314 X |
| 4,484,138 | 11/1984 | Bottomley et al. | 324/309 X |
| 4,549,139 | 10/1985 | MacFall et al. | 324/312 X |
| 4,549,140 | 10/1985 | MacFall | 324/312 X |
| 4,574,239 | 3/1986 | Singer | 324/309 X |
| * 4,628,262 | 12/1986 | Maudsley | 324/307 X |

OTHER PUBLICATIONS

"Spin Echoes"; Physical Review, vol. 80, No. 4, pp. 580-594; Nov. 1950; E. L. Hahn.
"Effects of Diffusion in Nuclear Magnetic Resonance Spin–Echo Experiments"; Journal of Chemical Physics, vol. 34, No. 6, pp. 2057-2061; Jun. 1961; D. E. Woessner.

Primary Examiner—Tom Noland
Attorney, Agent, or Firm—W. Brinton Yorks, Jr.

[57] ABSTRACT

A technique for producing multiple spin echo signals following an initial excitation pulse is provided. A first inverting pulse is applied a given time interval following the initial excitation pulse, resulting in the formation of the usual first spin echo signal after passage of the given time interval. At a later point in time, a second inverting pulse is applied. The time interval between the initial excitation pulse and this second inverting pulse is not required to be harmonically related to the first given time interval. This results in the production of at least a second, later occurring spin echo signal which does not contain harmonically-related artifact components of the earlier pulses and spin echo signals.

17 Claims, 6 Drawing Figures

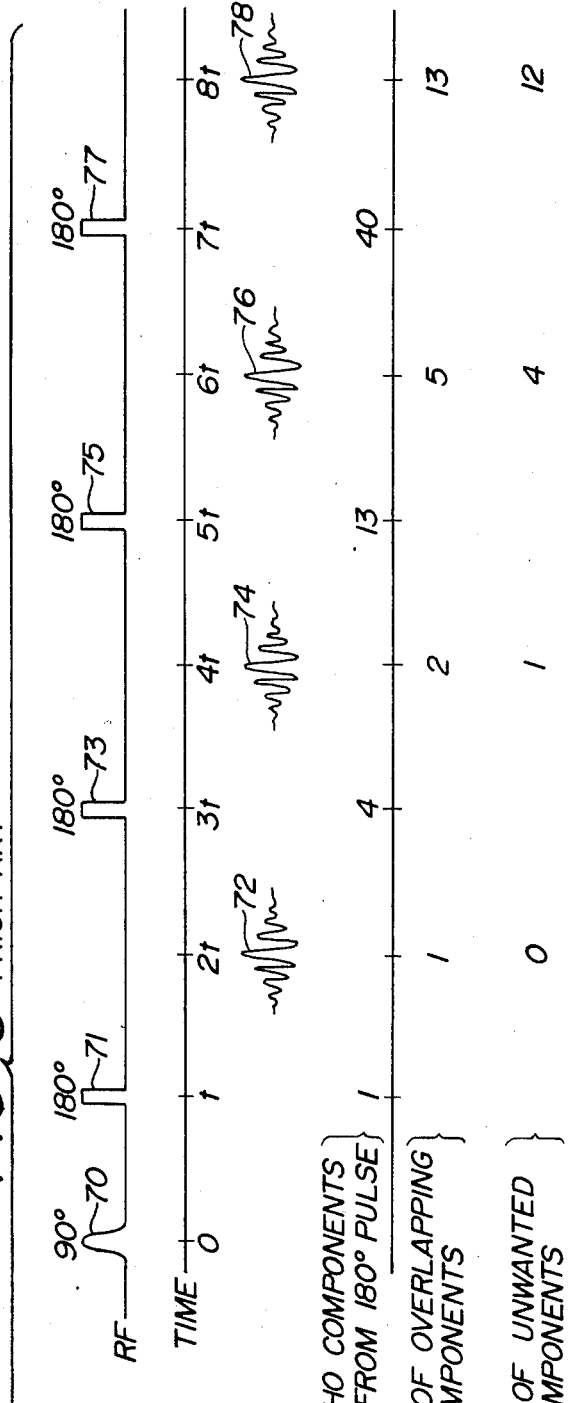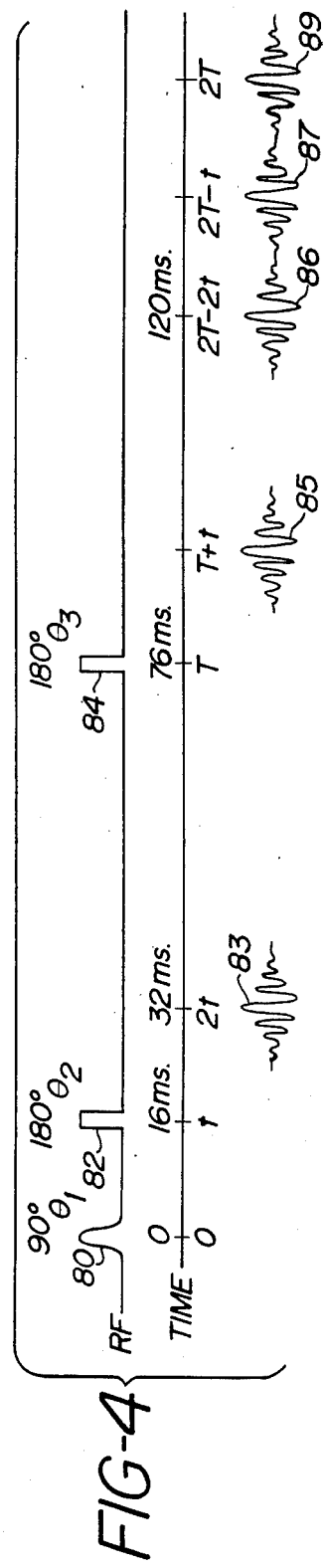

FIG-5

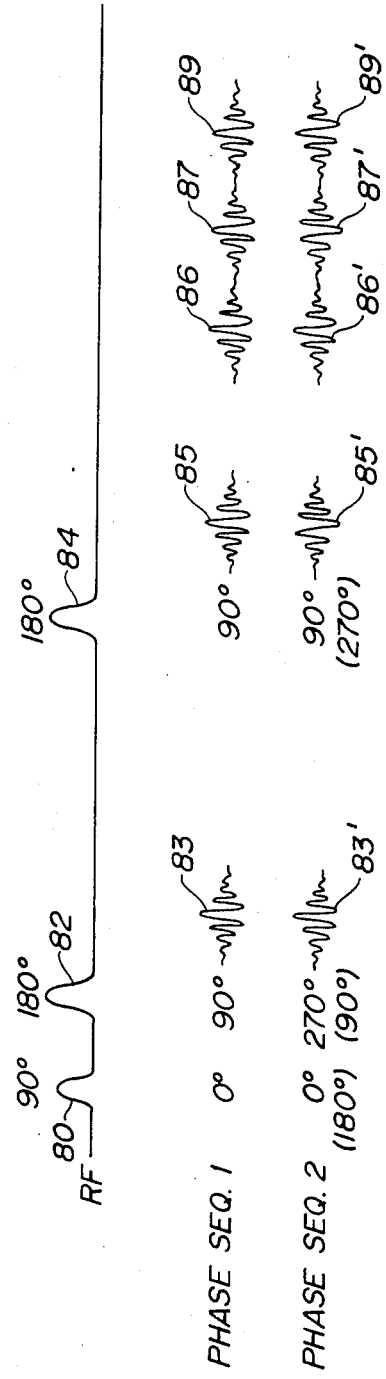

NON HARMONIC NMR SPIN ECHO IMAGING

BACKGROUND OF THE INVENTION

This invention relates to nuclear magnetic resonance (NMR) imaging systems and, in particular, to techniques for acquiring NMR information signals with short and long spin echo delays.

In NMR imaging systems there are two general techniques for collecting NMR information signals. One is to detect the free induction decay (FID) signals which are present immediately following a radio frequency (RF) excitation pulse. The immediacy of the occurrence of these signals is advantageous is that it allows NMR information to be gathered quickly, which can shorten the time required to gather the desired information. However, their near proximity in time to the excitation pulses makes detection difficult, since residual effects of these pulses can interfere with accurate detection of the FID signals. Also, switching from RF pulse transmission to FID signal reception becomes critical, especially when a common RF coil is used for both transmission and reception.

A second technique for NMR information acquisition is the spin echo technique. In this technique, the FID signals following the RF excitation pulses are ignored. At a later time a 180 degree inverting RF pulse is applied to refocus the previously excited spins. After another time interval a spin echo signal is produced which resembles back-to-back FID signals. The spin echo signal may be detected at a time when RF pulse effects have substantially dissipated, making data collection less critical. Also, in the time interval between the initial RF excitation pulse and the resulting spin echo signal, numerous gradient fields can be applied to the subject being imaged to imbue the spin echo signals with greater information content.

In the prior art, it is known that successive inverting RF pulses may be applied following the initial excitation pulse to repetitively refocus the spins. This results in the production of a sequence of spin echo signals. It has been found that spin echo imaging experiments which gather sequences of NMR information in this manner can produce at least two images of differing diagnostic utility. Images constructed from spin echoes occurring earlier in time relative to the initial excitation pulses will appear crisp and sharp. This is due to the high signal to noise ratios of these signals. When used for medical diagnosis these images will provide good anatomical representation. However, signal contrast will be relatively low.

Images constructed from spin echoes occurring later in time will have different diagnostic utility. Because of their relatively poorer signal to noise ratios, these images can appear to be smudgy or noisy. However, these images can exhibit relatively high spin-spin relaxation contrast. which provides good tissue characterization.

In the spin echo sequence techniques of the prior art, the successively occurring inverting RF pulses are applied at precisely timed, equal intervals after the RF excitation pulse. This results in the production of spin echo signals at regularly recurring time intervals, affording ease in timed signal acquisition. However, the present inventors have found that these techniques result in a complex form of harmonic signal distortion. Each regularly recurring spin echo signal will contain signal artifacts which are harmonically-related reflections of earlier applied and produced signals. By the time that the later occurring spin echoes are produced, these signals will contain artifact components resulting from amy imperfections in the earlier applied RF pulses. A great deal of the contrast of these later spin echoes can become obscured by these artifact components. Furthermore a larger number of RF pulses must be applied before a desired, later occurring spin echo signal is produced. It is desirable to reduce the amount of RF heating produced by these pulses by generating the later occurring spin echo signals with as few RF pulses as necessary in a given experiment.

SUMMARY OF THE INVENTION

In accordance with the principles of the present invention, a technique for producing multiple spin echo signals following an initial excitation pulse is provided. A first inverting pulse is applied a given time interval following the initial excitation pulse, resulting in the formation of the usual first spin echo signal after passage of the given time interval. Information from this first spin echo signal may be used in the construction of an image of high signal to noise ratio. At a later point in time, a second inverting pulse is applied. The time interval between the initial excitation pulse and this second inverting pulse is not required to be harmonically related to the first given time interval. This results in the production of at least a second, later occurring spin echo signal which does not contain harmonically-related artifact components of the earlier pulses and spin echo signals.

In this technique, a plurality of spin echo signals are generally produced after the second inverting pulse at times which are functions of the given time interval and the time interval between the initial excitation pulse and the second inverting pulse. One of these spin echo signals is the desired, later occuring spin echo, and the others are unwanted. The close proximity in time of these pulses can cause the unwanted signals to interfere with the sensitive detection of the desired signal. In accordance with the principles of a further aspect of the present invention, the phases of the RF pulses are coordinated so that ones of the unwanted signal components will destructively interfere with each other and thereby be eliminated. An ease in the sensitive detection of the desired later occuring spin echo signal is thus afforded.

IN THE DRAWINGS

FIG. 3 illustrates a multi-echo pulse sequence technique;

FIG. 4 illustrates a multi-echo pulse sequence technique in accordance with the principles of the present invention;

FIG. 5 illustrates a multi-echo pulse sequence technique, including gradient pulse waveforms; and FIG. 6 illustrates a technique for eliminating undesired spin echo signals in accordance with the principles of the present invention.

DESCRIPTION OF THE PREFERRED EMBODIMENTS

Figure 1:
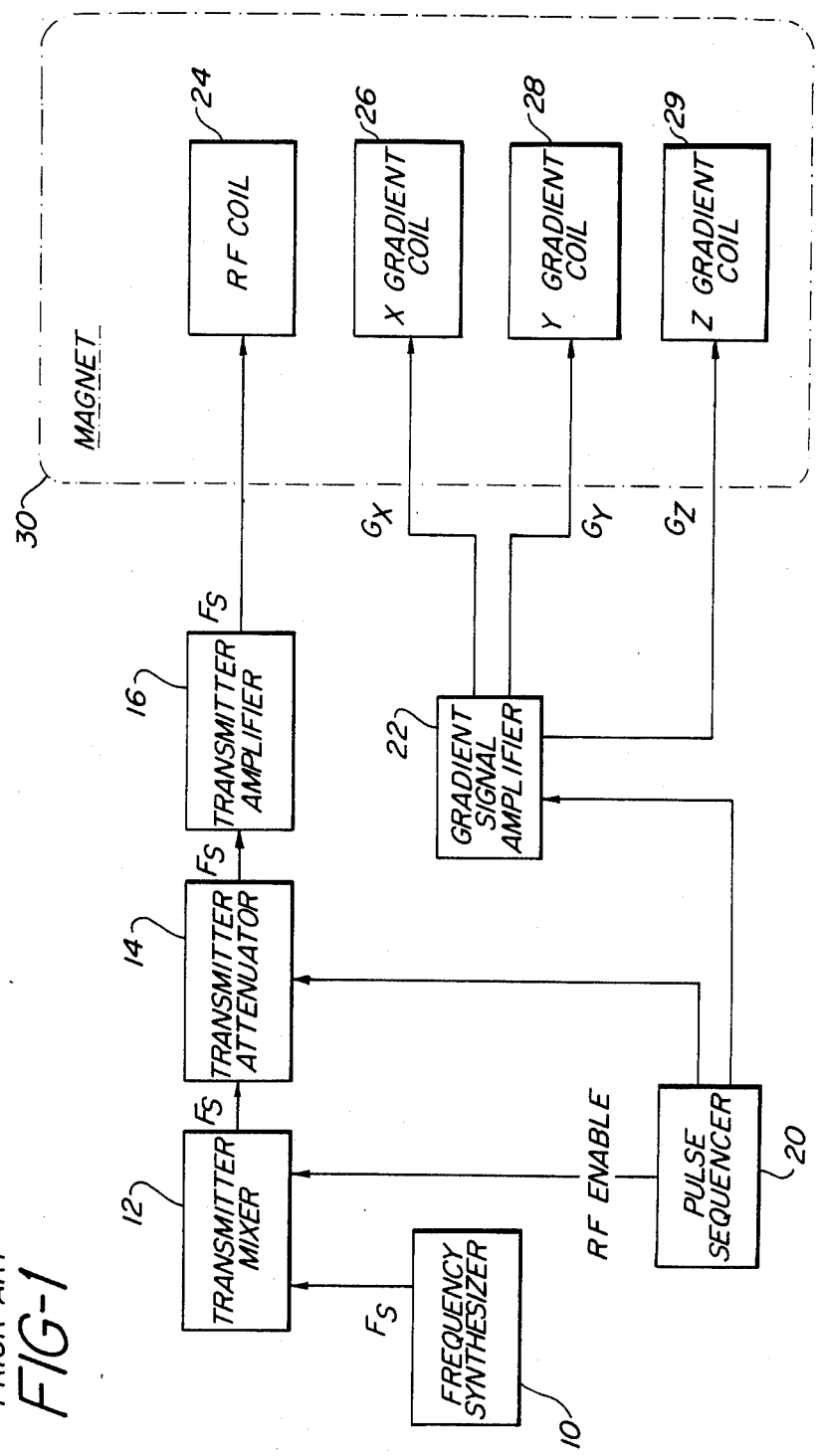
FIG. 1 illustrates in block diagram form the transmission portion of an NMR imaging system.
Figure 2:
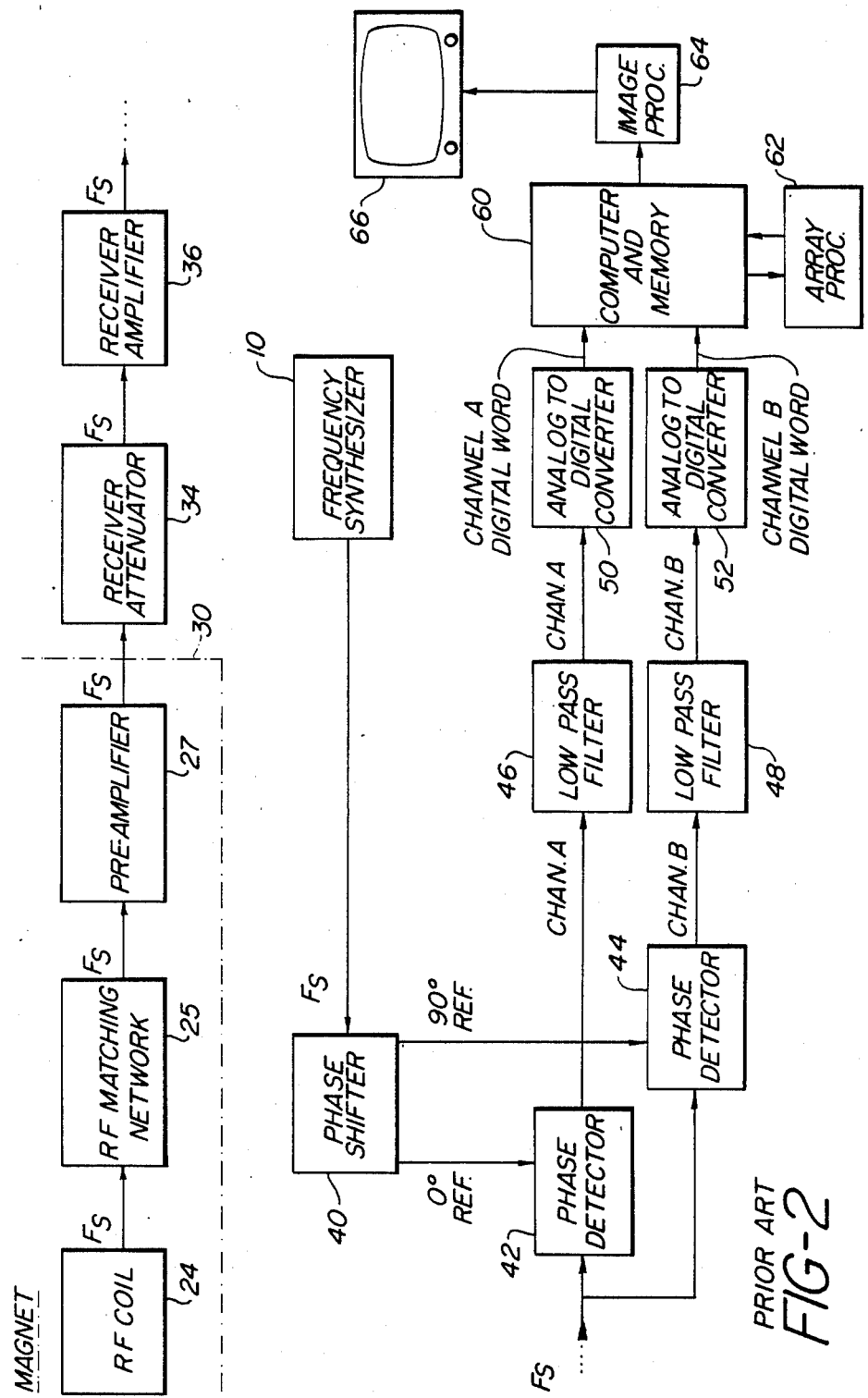
FIG. 2 illustrates in block diagram form the receiver portion of an NMR imaging system.

The NMR techniques of the present invention may be performed by an NMR imaging system such as that shown in block diagram form in FIGS. 1 and 2. Referring to FIG. 1, the transmission portion of an NMR imaging system is shown. A transmitter mixer 12 receives a signal $F_s$, where $F_s$ is the transmitted radio frequency NMR signal, from a frequency synthesizer 10. The $F_s$ signal is heterodyned by the mixer to produce a modulated $F_s$ signal, which is coupled by way of a controlled transmitter attenuator 14 to a transmitter amplifier 16. The transmitter mixer 12 and attenuator 14 are controlled by control signals provided by a pulse sequencer 20, which applies an RF enable signal to the mixer 12. The $F_s$ signal is amplified by the amplifier 16 and applied to the RF coil 24 in the magnet 30 in the form of a sequence of pulses formed under control of the pulse sequencer 20. The RF coil 24 applies the $F_s$ pulses to the subject being imaged.

Also located within the field of the magnet 30 are x, y, and z gradient coils 26, 28, and 29. These coils receive gradient control signals $G_x$, $G_y$, and $G_z$ from gradient signal amplifiers 22. The control signals are produced by the pulse sequencer 20.

The NMR signals emitted by the nuclei of the material being imaged induce $F_s$ return signals in the RF coil 24. These return signals are coupled by way of an RF matching network 25 to a pre-amplifier 27, and on to a receiver attenuator 34 as shown in FIG. 2. The received $F_s$ signals are amplified by an amplifier 36 and applied to quadrature phase detectors 42 and 44. The phase detectors receive two phase demodulating signals at respective 0° and 90° phase angles from a phase shifter 40, which receives an $F_s$ reference signal from the frequency synthesizer 10. The phase detectors 42 and 44 produce a channel A and a channel B signal, respectively. The baseband A and B signals are filtered by respective low pass filters 46 and 49, and the filtered signals are then sampled by respective analog to digital converters 50 and 52. The resultant channel A and channel B digital words are stored in the memory of a computer 60. The channel A and B digital words are then combined and transformed to the frequency domain by a Fourier transform array processor 62. The resultant image signals are assembled in an image format by an image processor 64, and the processed image is displayed on a video monitor 66.

Referring to FIG. 3, a multiple echo pulse sequence is shown in which the spin echoes are derived from a sequence of uniformly time spaced 180° inverting pulses. A 90° pulse 70 is applied to the subject by the RF coil to excite a group of nuclei. After a period of time t, a 180° pulse 72 is applied, resulting in the generation of a spin echo signal 72 at time 2t. The spin echo signal 72 exhibits good signal to noise characteristics, and may be used in combination with similarly acquired spin echo signals to produce a clearly defined image with good structural detail.

At time 3t, a second 180° pulse 73 is applied, producing another spin echo signal 74 at time 4t. Another 180° pulse 75 at time 5t produces a third spin echo signal 76 at time 6t. At time 7t a further 180° pulse 77 results in the development of the desired spin echo signal 78 at time 8t. The spin echo signal 78 exhibits poorer signal-to-noise characteristics than the previous signals, but has relatively high spin-spin relaxation contrast for the reconstruction of images with good tissue characterization.

However, the present inventors have found that successive echoes will contain an ever increasing number of artifact components derived by the harmonic reflection of earlier occurring signals and the imperfections of the successive 180 pulses. For example, as shown at the bottom of FIG. 3, spin echo signal 72 contains one echo component, which is the refocused equivalent of the FID signal occurring immediately after the 90° pulse 70. FID signals occur after every RF pulse, but are not shown in FIG. 3. Since the spin echo signal 72 contains only one echo component, there are no undesired artifacts associated with this signal.

The second 180° pulse 73 produces four echo components. By virtue of the choice of RF pulse delays of t and 3t for the 180° pulses 71 and 73, two of these components will coincide at time 4t. One of these signal components will contain phase-cancelling artifact components.

Similarly, thirteen spin echo signal components follow 180° pulse 75, of wich five occur at time 6t, where the desired component also appears. The desired, later occurring spin echo signal 78 contains thirteen echo components which are overlapping in time. The number of echo components following in the $n^{th}$ 180° pulse may be expressed mathematically as:

$$\text{Number of echo components} = \sum_{i=1}^{n} \binom{n}{i}^{2^{(i-1)}}$$

$$= \frac{1}{2}(3^n - 1)$$

Furthermore, FIG. 3 shows that five RF pulses must be applied in order to produce the desired later occurring spin echo signal 78. It is desirable to minimize RF heating by applying as few RF pulses as necessary to produce the wanted later occurring spin echo signal.

Referring now to FIG. 4, a multiple spin echo signal technique performed in accordance with the principles of the present invention is illustrated. A 90° RF excitation pulse 80 which exhibits a phase angle $\theta_1$, is applied initially. This pulse is followed at time t by a 180° RF inverting pulse 82 which exhibits a phase angle $\theta_2$.

At time 2t, which succeeds the inverting pulse 82 by the interval t, the first spin echo signal 83 is produced. As before, the first spin echo signal 83 may be used in the formation of an NMR image of good structural clarity. At time T following the 90° pulse 80, a second 180° pulse 84 with a phase angle $\theta_3$ is applied. This second inverting pulse results in the development of several spin echo signals at times which are reflections of the earlier time intervals about the pulse 84 at time T. A first, undesired spin echo signal 85 occurs at time T+t, which is a reflection of the earlier t interval about time T. The desired, later occurring spin echo signal 86 occurs at time 2T−2t, a time after the inverting pulse 84 which is equal to the time interval by which spin echo signal 83 precedes the inverting pulse 84. This desired signal is followed by two other unwanted spin echo signals 87 and 89. Signal 87 follows the inverting pulse 84 by an interval 2T−t, the interval by which pulse 82 and its FID signal precedes the pulse 84. Spin echo signal 87 thus contains echo components derived from the FID signal of inverting pulse 82. Finally, spin echo signal 89 occurs at time 2T, and contains echo components derived from the FID signal of the 90° excitation pulse 80. Unlike the later occurring spin echo signals of FIG. 3, there is no central overlap of desired and unwanted echo signals in the later occurring spin echo signals of FIG. 4 by reason of the non-harmonic relationship of the times at which the RF pulses are applied relative to each other. Other advantages include less RF heating and less cumbersome data handling than the sequence of FIG. 3. The most useful spin echo signals can be obtained without also acquiring intervening undesired signals, which otherwise occupy additional storage space and additional time to reconstruct unnecessary images and display. delete, or transfer to film. The inventive technique also overcomes the added sensitivity of desired signals to artifacts resulting from imperfections of the numerous RF pulses of the earlier technique.

Figure 5:
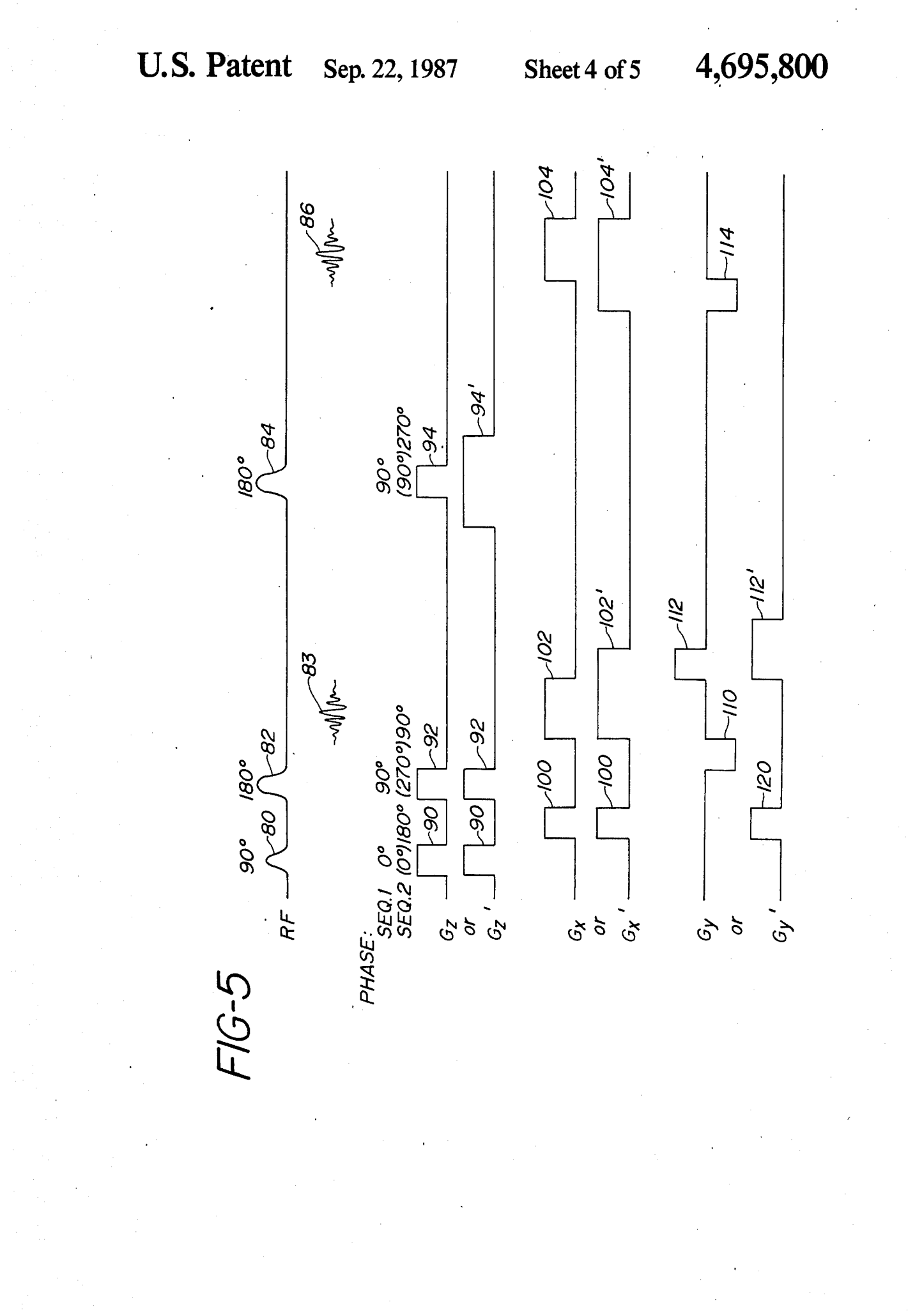

FIG. 5 shows the RF pulse sequence of FIG. 4, together with the applied gradient signals $G_x$, $G_y$, and $G_z$ for spatially identifying the spin echo signal components. The z direction gradient $G_z$ is used for slice selection by its application coincident in time with the RF pulses. $G_z$ pulses 90 and 92 are applied together with RF pulses 80 and 82, respectively, and $G_z$ pulse 94 is applied coincident with the second 180° pulse 84. In an alternative gradient pulse sequence $G_z$, pulse 94' is seen to start earlier in time and end later in time relative to RF pulse 84 as compared to $G_z$ pulse 94. This broader pulse 94' allows the $G_z$ gradient field at the time of RF pulse 84 some initial time to stabilize before RF pulse 84 begins, and the time at the end of pulse 94' helps dephase the FID signal resulting from any tip angle missettings caused by RF pulse 84. The broader pulse 94' also causes the Z direction rephasing time of the phase destructive spin echo signal next occurring (signal 85 in FIG. 4) to shift in time away from the desired signal 86 and toward the time of the 180° pulse 84. The $G_x$ pulses provide spatial frequency encoding in the x direction. A first $G_x$ pulse 100 is applied during the time interval between RF pulses 80 and 82. $G_x$ pulses 102 and 104 are "read" pulses, applied during the times that the desired spin echo signals are acquired, digitized and sent to the computer memory. An alternative $G_x$ pulse sequence, $G_x'$ is also shown. This sequence differs from the first in that the first read pulse 102' remains on for a time following spin echo signal 83. Correspondingly, read pulse 104' is turned on for a time interval preceding the occurrence of spin echo signal 86. The early portion of $G_x$ pulse 104' helps to dephase FID signals resulting from any misadjustment of RF pulse 84. It also helps cause the phase destructive echo signal 85 (see FIG. 4) to rephase earlier in time and further away from the desired spin echosignal 86. The latter extension of $G_x'$ pulse 102' is required to balance the early turnon of pulse 104'.

The $G_y$ pulses provide spatial phase encoding in the y direction. Ones of these pulses are generally varied in amplitude from one sequence to the next for subsequent Fourier processing of the received spin echo signals. A first $G_y$ pulse 110 is applied after 180° pulse 82 and before the first spin echo signal 83 is acquired. A second $G_y$ pulse 112 is applied following spin echo signal 83, thereby reversing the effect of $G_y$ pulse 110 in preparation for phase encoding for the later occurring spin echo signal 86. A $G_y$ pulse 114 provides phase encoding for the later occurring spin echo signal 86. An alternative $G_y$ pulse sequence, $G_y'$, is also shown. In this sequence, a first $G_y'$ pulse 120 provides phase encoding for spin echo signal 83. Pulse 120 is of opposite polarity to pulse 110 because pulse 120 precedes the RF inverting pulse 82. $G_y'$ pulse 112' follows spin echo signal 83 and is longer than pulse 112 to both cancel the effect of pulse 120 and provide phase encoding for later spin echo signal 86. Pulse 112' is of opposite polarity to pulse 114 because pulse 112' precedes the second RF inverting pulse 84.

Below the RF pulses of FIG. 5 are indicated the phases of the RF pulses from one sequence to another. In accordance with a further aspect of the present invention, phase sequencing of the RF pulses may be selected so as to eliminate ones of the undesired spin echo signals from an accumulation of received spin echo signals. This phase sequencing and its effects are illustrated in FIG. 6. In a first sequence, the RF pulses are applied to produce spin echo signals 83 and 85–89. The RF pulses 80, 82, and 84 exhibit phase angles of 0°, 90° and 90°, respectively during this first sequence.

During a second RF pulse sequence, the pulses 80, 82 and 84 exhibit phase angles of 0°, 270°, and 90°, respectively (or, alternatively, 180°, 90°, and 270°, respectively). The effect of this phase alteration from the first to the second sequence is to cause ones of the spin echo signals of the second sequence to exhibit new phases. It may be seen that spin echo signal 83' of the second sequence is in phase with previously acquired spin echo signal 83. These two signals may be combined during processing, affording constructive signal enhancement.

The RF pulse phase alteration is seen to cause spin echo signals 86' and 89' to exhibit the same phases as corresponding signals 86 and 89 of the first sequence. Thus, when combined, the desired, later occurring spin echo signals 86 and 86' will enhance one another. However, spin echo signals 85' and 87' are seen to have undergone a phase alteration. When combined with corresponding signals 85 and 87, these signals will cancel one another. Importantly, these cancelling signals are the unwanted signal components on either side of the desired signals 86 and 86'. This cancellation will thus leave an artifact-free desired signal and result in improved signal to noise characteristics of the combined signals 86 and 86'.

What is claimed is:

1. Nuclear magnetic resonance apparatus for producing resonance information in the form of first and second spin echo signals in which an initial nuclear magnetic resonance signal is repetitively refocused by successive refocusing radio frequency signals, comprising:

means for applying a static magnetic field to a subject being examined;

means for applying a first radio frequency signal to said subject at a first predetermined time for inducing an initial nuclear magnetic resonance information signal;

means for applying a second, refocusing radio frequency signal to said subject at a second predetermined time for generating a first spin echo signal at a time following said first radio frequency signal; and means for applying one or more additional radio frequency signals to said subject at respective predetermined times for refocusing the information of said first spin echo signal about a point in time separated from the last of said additional radio frequency signals by a given time interval to form a desired spin echo signal, said additional radio frequency signals also generating undesired signal components derived from earlier-occurring nuclear magnetic resonance signals, and said given time interval not exhibiting a harmonic relationship to the time intervals between ones of said radio frequency signals, whereby there is no substantial overlap in time of said desired spin echo signal by said undesired signal components.

2. The nuclear magnetic resonance apparatus of claim 1, wherein said second and subsequent radio frequency signals are each a 180° inverting radio frequency pulse.

3. The nuclear magnetic resonance apparatus of claim 2, wherein said first radio frequency signal is a 90° pulse.

4. The nuclear magnetic resonance apparatus of claim 3, further comprising gradient field apparatus for imposing selected gradient fields on said subject during the sequence of applied radio frequency signals to spatially encode the generated spin echo signals.

5. Nuclear magnetic resonance apparatus for producing resonance information in the form of first and second spin echo signals, the second of which is refocused from the first, comprising:
   means for applying a static magnetic field to a subject being examined:
   means for applying a first radio frequency signal to said subject for inducing nuclear magnetic resonance information signals;
   means for applying a second radio frequency signal to said subject for generating spin echo signals at the end of a first predetermined time interval following said first radio frequency signal; and
   means for applying a third radio frequency signal to said subject for generating spin echo signals at the end of a second predetermined time interval following said first radio frequency signal, which second predetermined time interval is not harmonically related in duration to the duration of time intervals between ones of said radio frequency signals.

6. The nuclear magnetic resonance apparatus of claim 5, wherein said second and third radio frequency signals are each 180° inverting radio frequency pulses.

7. The nuclear magnetic resonance apparatus of claim 6, wherein said first radio frequency signal is a 90° pulse.

8. The nuclear magnetic resonance apparatus of claim 5. further comprising gradient field apparatus for imposing selected gradient fields on said subject during said second predetermined time interval to spatially encode said generated spin echo signals.

9. The nuclear magnetic resonance apparatus of claim 8, wherein said duration of said second predetermined time interval is more than twice the duration of said first predetermined time interval.

10. Nuclear magnetic resonance apparatus for producing resonance information in the form of first and second spin echo signals, the second of which is a refocused equivalent of the first, comprising:
   means for applying a static magnetic field to a subject being examined:
   means for applying a first radio frequency signal to said subject for inducing nuclear magnetic resonance information signals;
   means for applying a second radio frequency signal to said subject for generating said first spin echo signals after a first predetermined time period following said first radio frequency signal; and
   means for applying a third radio frequency signal to said subject for generating a a plurality of spin echo signals including at least one undesired spin echo signal, and a desired second spin echo signal occurring after a second predetermined time period following said first radio frequency signal, said first and second time periods being chosen so that said desired and undesired spin echo signals are substantially nonoverlapping in their times of occurrence.

11. The nuclear magnetic resonance apparatus of claim 10, wherein said second predetermined time period is nonharmonically related to said first predetermined time period.

12. The nuclear magnetic resonance of claim 10, wherein the time of occurrence of said undesired spin echo signal is related to the time of occurrence of a radio frequency signal applied following said first radio frequency signal and prior to the application of said third radio frequency signal.

13. The nuclear magnetic resonance apparatus of claim 10, wherein said radio frequency signal applying means applies signals with differing phase relationships, whereby repetitively generated undesired spin echo signals will exhibit phases causing signal cancellation when such signals are combined.

14. In nuclear magnetic resonance apparatus, a method for generating a plurality of spin echo signals which are successively refocused equivalents of an initial nuclear magnetic resonance signal comprising the steps of:
   (a) applying a static magnetic field to a subject being examined:
   (b) applying a first radio frequency signal to said subject at a first predetermined time for inducing nuclear magnetic resonance signals;
   (c) applying a second radio frequency signal to said subject at a second predetermined time for generating first spin echo signals at a time following said first radio frequency signal; and
   (d) applying one or more additional radio frequency signals to said subject at respective times for generating desired spin echo signals refocused from said first spin echo signals a predetermined time interval following the last of said additional radio frequency signals, said predetermined time interval being nonharmonically related to the time intervals between ones of said frequency signals.

15. The method of claim 14, wherein steps (c) and (d) each further comprise the steps of applying a 180° inverting radio frequency pulse to said subject.

16. The method of claim 15, wherein step (b) further comprises the step of applying a 90° radio frequency excitation pulse to said subject.

17. The method of claim 14, wherein each applied radio frequency signal exhibits a predetermined phase, and further comprising the step of:
   (e) repeating steps (b), (c) and (d) with at least one of said applied radio frequency signals exhibiting a different phase relative to steps (b), (c) and (d), whereby at least one spin echo signal generated will exhibit a different phase than a corresponding spin echo signal generated following said corresponding radio frequency signal preceding the repeat of step (b).

* * * * *